(12) United States Patent
Chen

(10) Patent No.: US 8,778,066 B2
(45) Date of Patent: Jul. 15, 2014

(54) VACUUM PUMP EXHAUST PIPE OF CHEMICAL VAPOR DEPOSITION APPARATUS AND RELEVANT VACUUM PUMP

(75) Inventor: Peng Chen, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 77 days.

(21) Appl. No.: 13/378,265

(22) PCT Filed: Sep. 27, 2011

(86) PCT No.: PCT/CN2011/080211
§ 371 (c)(1),
(2), (4) Date: Apr. 27, 2012

(87) PCT Pub. No.: WO2013/040800
PCT Pub. Date: Mar. 28, 2013

(65) Prior Publication Data
US 2013/0076032 A1 Mar. 28, 2013

(30) Foreign Application Priority Data
Sep. 23, 2011 (CN) .......................... 2011 1 0285412

(51) Int. Cl.
*C23C 16/54* (2006.01)
*H01L 21/02* (2006.01)
*H01L 21/00* (2006.01)

(52) U.S. Cl.
USPC .................. 96/243; 454/43; 454/49; 454/187; 454/339; 138/140; 138/177; 138/114; 165/134.1; 165/133; 165/135; 165/143; 165/154

(58) Field of Classification Search
CPC ......... F16L 21/00; F16L 58/1036; F16L 9/18; F16L 11/20; F16L 59/065; F16L 58/16
USPC .................................................. 55/385.2, 435
See application file for complete search history.

(56) References Cited

U.S. PATENT DOCUMENTS 5,498,036 A * 3/1996 Kingsford .................. 285/123.1
2012/0055403 A1* 3/2012 Gomi et al. ................... 118/725

FOREIGN PATENT DOCUMENTS

WO    WO 2010101191 A1 *  9/2010  ............ H01L 21/683

* cited by examiner

*Primary Examiner* — Duane Smith
*Assistant Examiner* — Cabrena Holecek
(74) *Attorney, Agent, or Firm* — Ditthavong & Steiner, P.C.

(57) ABSTRACT

Disclosed is a vacuum pump exhaust pipe of a chemical vapor deposition apparatus, wherein two ports of the vacuum pump exhaust pipe are respectively connected to a vacuum pump outlet and a scrubber, and anti-sticking inner pipes are installed inside the exhaust pipe and closely contacted with inner walls of the exhaust pipe. The present invention also relates to a vacuum pump of the chemical vapor deposition apparatus. Blockage hardly occurs in the vacuum pump exhaust pipe of the chemical vapor deposition apparatus and the relevant vacuum pump according to the present invention to solve problems of the easily found blockage in the exhaust pipe, wasting the manpower and the time for clearing the exhaust pipe and the effect to the uptime of the chemical vapor deposition apparatus in the prior arts.

18 Claims, 3 Drawing Sheets

VACUUM PUMP EXHAUST PIPE OF CHEMICAL VAPOR DEPOSITION APPARATUS AND RELEVANT VACUUM PUMP

BACKGROUND OF THE INVENTION

1. Field of the Invention

The present invention generally relates to a semiconductor manufacture field, and more particularly to a vacuum pump exhaust pipe of a chemical vapor deposition apparatus and a relevant vacuum pump capable of extending the preventive maintenance cycle of the apparatus.

2. Description of Prior Art

A plasma-enhanced chemical vapor deposition apparatus is in charge of vapor depositions for forming plural thin film layers in a thin film transistor. As shown in FIG. 1, a reaction chamber of the plasma-enhanced chemical vapor deposition apparatus is denoted by 100. A vacuum pump is denoted by 200. A vacuum pump exhaust pipe is denoted by 300. A scrubber is denoted by 400. In the deposition process, the thin film is not merely formed on a surface of a substrate but also on the inner wall of the reaction chamber 100. The non-reacted gases are vented to the scrubber 400 by the vacuum pump 200 for burning process. In the entire chemical vapor deposition process, the usage percentage of the total gases is less then 10% and a large amount of non-reacted gases are vented. As the exhaust gases are vented to the outlet of the vacuum pump 200, the pressure here rises to 600 Pascal and temperature here drops to 100 degree Celsius. The density of $O_2$ rapidly ascends. The components of the exhaust gases can be $SiH_4$, $H_2$, $N_2$, $NH_3$ and etc. The exhaust gases may react with each other or with the inner wall to generate byproduct powders. Such byproduct powders can block the vacuum pump exhaust pipe 300 at the outlet of the vacuum pump 200. Therefore, the vacuum pump exhaust pipe 300 at the outlet of the vacuum pump 200 cannot vent gases fluently and causes alarms to the main apparatus and abandoned products. The procedure of dealing the blockage in the exhaust pipe 300 at the outlet of the vacuum pump 200 is: removing the exhaust pipe 300 at the outlet of the vacuum pump 200 every two weeks. The exhaust pipe 300 is cleaned with water, dried and then re-installed. The whole preventive maintenance needs two men operations and the pipe cleaning procedure for one reaction chamber takes one hour. The manpower and the time are wasted and the uptime of the chemical vapor deposition apparatus is affected.

Consequently, there is a need to provide a vacuum pump exhaust pipe of a chemical vapor deposition apparatus and a relevant vacuum pump to solve the existing problems of prior arts.

SUMMARY OF THE INVENTION

An objective of the present invention is to provide a vacuum pump exhaust pipe of a chemical vapor deposition apparatus and a relevant vacuum pump which blockage hardly occurs to solve problems of the easily found blockage in the exhaust pipe, wasting the manpower and the time for clearing the exhaust pipe and the effect to the uptime of a plasma-enhanced chemical vapor deposition apparatus in the prior arts.

The present invention relates to a vacuum pump exhaust pipe of a chemical vapor deposition apparatus, wherein two ports of the vacuum pump exhaust pipe are respectively connected to a vacuum pump outlet and a scrubber. Anti-sticking inner pipes are installed inside the exhaust pipe and closely contacted with inner walls of the exhaust pipe. A material of the anti-sticking inner pipes is Polytetrafluoroethene. The anti-sticking inner pipes are installed at a joint of the vacuum pump outlet and the exhaust pipe and at a joint of the scrubber and the exhaust pipe. Outer surfaces of portions of the exhaust pipe which are not installed with the anti-sticking inner pipes are attached with heating tapes.

The present invention also relates to a vacuum pump exhaust pipe of a chemical vapor deposition apparatus, wherein two ports of the vacuum pump exhaust pipe are respectively connected to a vacuum pump outlet and a scrubber, characterized in that anti-sticking inner pipes are installed inside the exhaust pipe and closely contacted with inner walls of the exhaust pipe.

In one embodiment of the present invention, a material of the anti-sticking inner pipes is Polytetrafluoroethene.

In one embodiment of the present invention, the anti-sticking inner pipe is installed at a joint of the vacuum pump outlet and the exhaust pipe.

In one embodiment of the present invention, the anti-sticking inner pipe is installed at a joint of the scrubber and the exhaust pipe.

In one embodiment of the present invention, the anti-sticking inner pipes are installed at a joint of the vacuum pump outlet and the exhaust pipe and at a joint of the scrubber and the exhaust pipe at the same time.

In one embodiment of the present invention, outer surfaces of portions of the exhaust pipe which are not installed with the anti-sticking inner pipe are attached with heating tapes.

The present invention also relates to a vacuum pump of a chemical vapor deposition apparatus, wherein two ports of the vacuum pump are respectively connected to an outlet of the chemical vapor deposition apparatus and a scrubber. The vacuum pump comprises an exhaust pipe connected to the scrubber. Anti-sticking inner pipes are installed inside the exhaust pipe and closely contacted with inner walls of the exhaust pipe. A material of the anti-sticking inner pipes is Polytetrafluoroethene.

In one embodiment of the present invention, the anti-sticking inner pipes are installed at a joint of the vacuum pump outlet and the exhaust pipe and at a joint of the scrubber and the exhaust pipe.

The one embodiment of the present invention, the anti-sticking inner pipe is installed at a joint of the vacuum pump outlet and the exhaust pipe.

In one embodiment of the present invention, the anti-sticking inner pipe is installed at a joint of the scrubber and the exhaust pipe.

In one embodiment of the present invention, outer surfaces of portions of the exhaust pipe which are not installed with the anti-sticking inner pipe are attached with heating tapes.

In one embodiment of the present invention, the anti-sticking inner pipes are installed at all the inner walls of the exhaust pipe.

Comparing with the vacuum pump exhaust pipe of the chemical vapor deposition apparatus in the prior arts with problems of the easily found blockage in the exhaust pipe, wasting the manpower and the time for clearing the exhaust pipe and the effect to the uptime of the plasma-enhanced chemical vapor deposition apparatus, the vacuum pump exhaust pipe of the chemical vapor deposition apparatus and the relevant vacuum pump employ the Polytetrafluoroethene anti-sticking inner pipes to prohibit blockage in the exhaust pipe formed by the exhaust gases from the chemical vapor deposition apparatus. Accordingly, the drawbacks of the prior arts can be prevented.

For a better understanding of the aforementioned content of the present invention, preferable embodiments are illustrated in accordance with the attached figures for further explanation:

DETAILED DESCRIPTION OF THE INVENTION

The following descriptions for the respective embodiments are specific embodiments capable of being implemented for illustrations of the present invention with referring to appended figures. For example, the terms of up, down, front, rear, left, right, interior, exterior, side, etcetera are merely directions of referring to appended figures. Therefore, the wordings of directions are employed for explaining and understanding the present invention but not limitations thereto.

In figures, the elements with similar structures are indicated by the same number.

Figure 1:
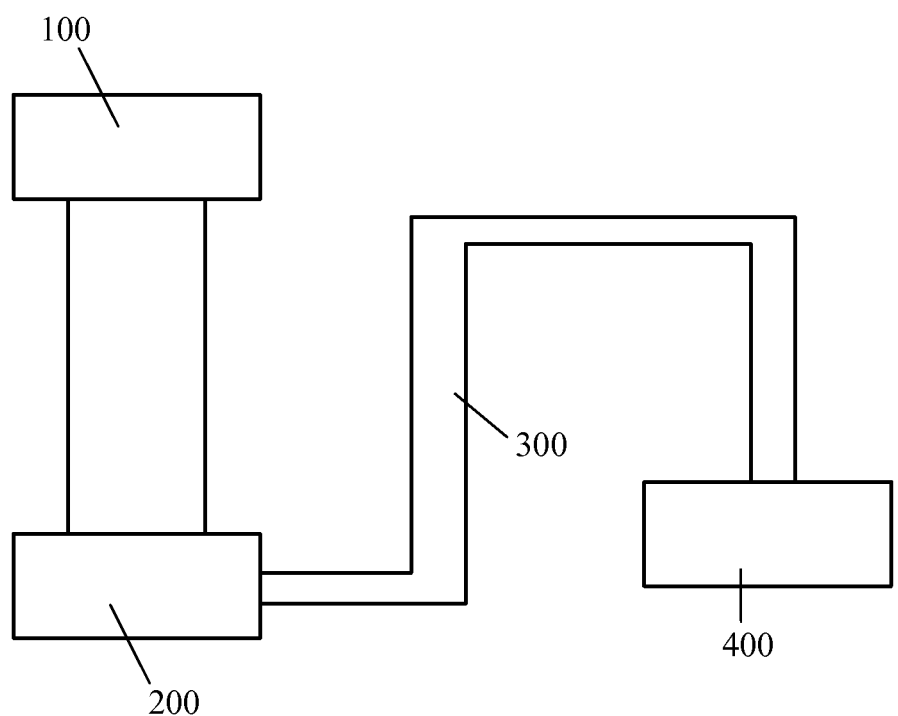
FIG. 1 depicts a connection diagram of a chemical vapor deposition apparatus, an exhaust pipe and a scrubber system.
Figure 2:
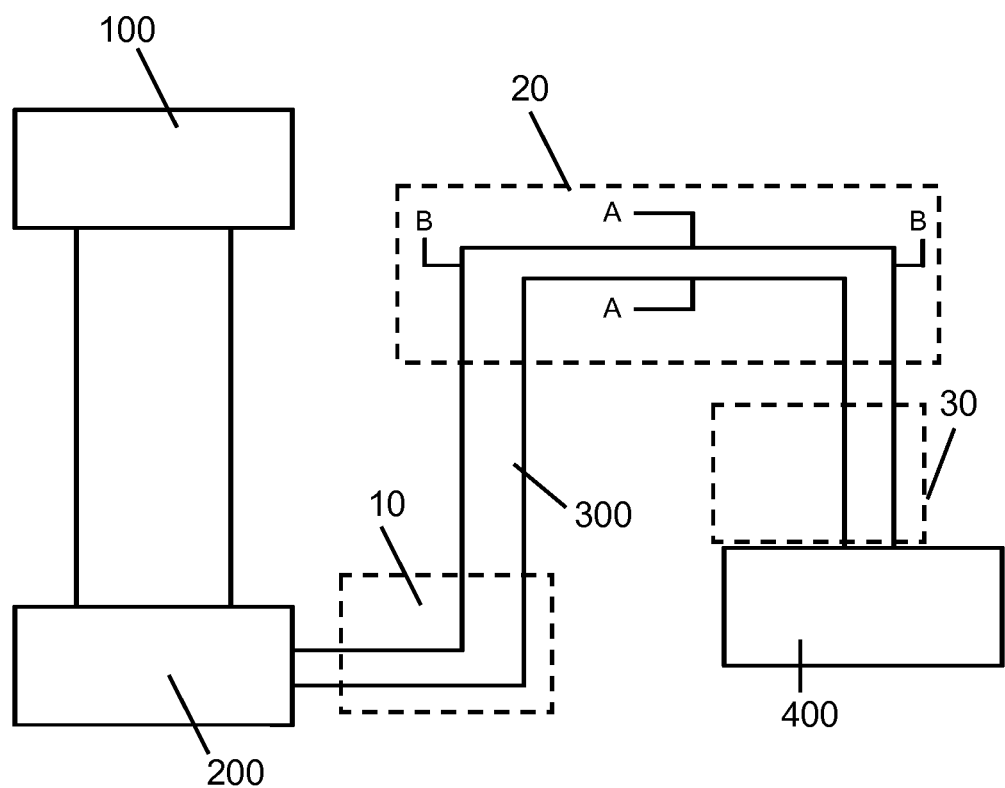
FIG. 2 depicts a connection diagram of a vacuum pump exhaust pipe of a chemical vapor deposition apparatus according to preferable embodiments of the present invention.

FIG. 2 depicts a connection diagram of a vacuum pump exhaust pipe of a chemical vapor deposition apparatus according to a preferable embodiment of the present invention. As described in prior art section, as the plasma-enhanced chemical vapor deposition apparatus is performing etching and filming processes, the flow of the reaction gases are facility supplies—gas tanks—gas source terminals—reaction chamber 100—vacuum pump 200—scrubber 400—atmosphere and a whole flow is completed. The vacuum pump 200 is connected to the scrubber 400 with an exhaust pipe 300. In the whole flow of reaction gases, the gas flow environment is under high degree of vacuum and low pressure from the facility supplies to the vacuum pump 200 without the effect of the external environment. After exhaust gases generated in the reaction chamber 100 are vented to the exhaust pipe 300 behind the vacuum pump 200, the degree of vacuum descends. The densities of the exhaust gases ascend and the density of the $O_2$ rapidly ascends, too. Moreover, the exhaust pipe 300 is exposed to contact with the external environment with a lower temperature. Therefore, powder particles can be easily formed on the inner walls of the exhaust pipe 300 and the blockage of the exhaust pipe 300 happens as time passed, ultimately.

Figure 3:
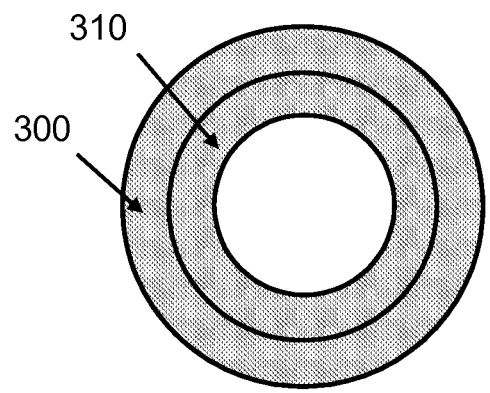
FIG. 3 depicts a sectional diagram taken along line A-A of FIG. 2.
Figure 4:
FIG. 4 depicts a sectional diagram taken along line B-B of FIG. 2.

As shown in FIG. 3 and FIG. 4, anti-sticking inner pipes 310 are installed inside the exhaust pipe 300 and closely contacted with inner walls of the exhaust pipe 300. The material of the anti-sticking inner pipes 310 is preferably to be Polytetrafluoroethene. Polytetrafluoroethene is a macromolecular compound polymerized by Tetrafluoroethene. The Polytetrafluoroethene has advantages of excellent chemical stability, resistant to corrosion, sealing performance, anti-sticking, electric insulation and ageing resistance. The excellent chemical stability of the Polytetrafluoroethene allows the anti-sticking inner pipes 310 not to react with any exhaust gases. The anti-sticking property of the Polytetrafluoroethene makes the anti-sticking inner pipes 310 with bad adhesion. The inner walls of the anti-sticking inner pipes 310 are hardly adhered by any powder particles generated in the anti-sticking inner pipes 310. The powder particles are easily inhaled by the scrubber 400. Therefore, blockage hardly happens to the exhaust pipe 300 with the anti-sticking inner pipes 310 and the manpower and the time of cleaning the exhaust pipe 300 can be saved and the effect to the uptime of the plasma-enhanced chemical vapor deposition apparatus can be reduced. Other anti-sticking material also can be illustrated for the anti-sticking inner pipes 310.

As shown in FIG. 2, a vacuum pump exhaust pipe of a chemical vapor deposition apparatus according to a first preferable embodiment of the present invention is illustrated. The anti-sticking inner pipe 310 is installed at a joint of the outlet of the vacuum pump 200 and the exhaust pipe 300. As shown in the area 10 of FIG. 2, only the outlet of the vacuum pump 200 is installed with the anti-sticking inner pipe 310. The densities of the exhaust gases are in maximum and most of the powder particles are generated in the area 10 because the pressure ascension here is most distinct. The anti-sticking inner pipe 310 installed at the area 10 can most efficiently decrease the powder particle accumulations in the exhaust pipe 300, and more particularly to prevent the powder particle accumulations at the joint of the vacuum pump outlet and the exhaust pipe 300. Meanwhile, the cost of manufacturing and installing the anti-sticking inner pipe 310 is in minimum.

As shown in FIG. 2, a vacuum pump exhaust pipe of a chemical vapor deposition apparatus according to a second preferable embodiment of the present invention is illustrated. The anti-sticking inner pipe 310 is installed at a joint of the scrubber 400 and the exhaust pipe 300. As shown in the area 30 of FIG. 2, only the outlet of the exhaust pipe 300 is installed with the anti-sticking inner pipe 310. The pressure of the exhaust gases rises further because the exhaust gases from the exhaust pipe 300 is entering the scrubber 400 here. The powder particles here are generated easier than in the middle of the exhaust pipe 300 (such as the area 20). Therefore, the anti-sticking inner pipe 310 installed in the area 30 can decrease the powder particle accumulations better, and particularly decrease the powder particle accumulations in the joint at the scrubber 400 and the exhaust pipe 300. The manufacture and installation cost of the anti-sticking inner pipe 310 is similar to that of the first preferable embodiment.

As shown in FIG. 2, a vacuum pump exhaust pipe of a chemical vapor deposition apparatus according to a third preferable embodiment of the present invention is illustrated. The anti-sticking inner pipes 310 are installed at a joint of the outlet of the vacuum pump 200 and the exhaust pipe 300 and at a joint of the scrubber 400 and the exhaust pipe 300 at the same time. The concrete effects can be referred to the descriptions in the foregoing first and second embodiments. Because the sequence of the blockage degree of the exhaust pipe 300 is area 10>area 30>area 20, the effects of the blockages at the area 10 and area 30 are most serious. Meanwhile, manufacturing and installing the anti-sticking inner pipes 310 in the area 10 and area 30 is easier and the cost is lower. Therefore, installing the anti-sticking inner pipes 310 in the area 10 and area 30 at the same time in this embodiment can achieve the best effect of preventing blockage without adding a high cost.

As shown in FIG. 2, a vacuum pump exhaust pipe of a chemical vapor deposition apparatus according to a fourth preferable embodiment of the present invention is illustrated. Outer surfaces of portions of the exhaust pipe 300 which are not installed with the anti-sticking inner pipes 310 are attached with heating tapes. The reason of the powder particle accumulations in the anti-sticking inner pipes 310 and the exhaust pipe 300 is caused by the pressure rise and the temperature difference between the exhaust pipe 300 and the exhaust gases. While one or two ports (area 10 or/and area 30) of the exhaust pipe 300 are installed the anti-sticking inner pipes 310 inside, in the areas where the anti-sticking inner pipes 310 cannot be installed or the installation cost is higher, and particularly in the middle of the exhaust pipe 300 (area 20), the heating tapes are attached to the outer surfaces of the exhaust pipe 300 in these positions for heating the exhaust pipe 300. By decreasing the temperature difference between the exhaust pipe 300 and the exhaust gases, the powder particle accumulations on the inner walls of the exhaust pipe 300 can be decreased where the anti-sticking inner pipes 310 are not installed. Accordingly, the preventive maintenance cycle of the whole exhaust pipe 300 can be extended to reduce the effect to the uptime of a plasma-enhanced chemical vapor deposition apparatus.

In a vacuum pump exhaust pipe of a chemical vapor deposition apparatus according to the fifth preferable embodiment of the present invention, the anti-sticking inner pipes 310 are installed at all the inner walls of the exhaust pipe 300. In this embodiment, all the inner walls of the exhaust pipe 300 are installed with the anti-sticking inner pipes 310 to maximitaly extend the preventive maintenance cycle of the whole exhaust pipe 300 and to reduce the effect to the uptime of a plasma-enhanced chemical vapor deposition apparatus. However, the anti-sticking inner pipes 310 are installed in the middle (area 20) of the exhaust pipe 300, the difficulty level and the cost are both high.

Before the anti-sticking inner pipes 310 are installed inside the vacuum pump exhaust pipe of the chemical vapor deposition apparatus according to the present invention, the pipes of the Polytetrafluoroethene material are machine-shaped as being the anti-sticking inner pipes 310 and installed at the relevant positions of the exhaust pipe 300 where need to be protected. It is required that the outer diameter of the anti-sticking inner pipe 310 needs to be fit with the inner diameter of the exhaust pipe 300 to guarantee the smooth exhaust for sure. Meanwhile, the thickness of the anti-sticking inner pipe 310 is preferably to be 1 mm-3 mm. The better venting effect can be guaranteed and the best preventing effect to the powder particle accumulations can be achieved. The lengths of the anti-sticking inner pipes 310 are determined by the lengths of the exhaust pipe 300 and the relevant demands for the positions of installing the anti-sticking inner pipes 310.

The present invention also relates to a vacuum pump of a chemical vapor deposition apparatus, wherein two ports of the vacuum pump are respectively connected to an outlet of the chemical vapor deposition apparatus and a scrubber. The vacuum pump comprises an exhaust pipe connected to the scrubber. Anti-sticking inner pipes are installed inside the exhaust pipe and closely contacted with inner walls of the exhaust pipe. A material of the anti-sticking inner pipes is Polytetrafluoroethene. The anti-sticking inner pipes are installed at a joint of the vacuum pump outlet and the exhaust pipe and/or at a joint of the scrubber and the exhaust pipe. Alternatively, the anti-sticking inner pipes are installed at all the inner walls of the exhaust pipe.

The benefits and specific embodiments of the vacuum pump of the chemical vapor deposition apparatus are the same or similar to those of the vacuum pump exhaust pipe of the chemical vapor deposition apparatus. Please refer to the specific embodiments of the vacuum pump exhaust pipe of the chemical vapor deposition apparatus for specific details.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A vacuum pump exhaust pipe of a chemical vapor deposition apparatus, wherein two ports of the vacuum pump exhaust pipe are respectively connected to a vacuum pump outlet and a scrubber, characterized in that anti-sticking inner pipes are installed inside the exhaust pipe and contacted with inner walls of the exhaust pipe, and a material of the anti-sticking inner pipes is Polytetrafluoroethene, and the anti-sticking inner pipes are installed at a joint of the vacuum pump outlet and the exhaust pipe and at a joint of the scrubber and the exhaust pipe to configure said joints to prevent accumulation of powder particles generated by gases through the exhaust pipe while pressure ascension, and outer surfaces of portions of the exhaust pipe, which are not installed with the anti-sticking inner pipes where a temperature difference between the exhaust pipe and exhaust gases occurs, are attached with heating tapes.

2. A vacuum pump exhaust pipe of a chemical vapor deposition apparatus, wherein two ports of the vacuum pump exhaust pipe are respectively connected to a vacuum pump outlet and a scrubber, characterized in that anti-sticking inner pipes are installed inside the exhaust pipe and contacted with inner walls of the exhaust pipe, and have a property of preventing accumulation of powder particles generated by gases through the exhaust pipe while pressure ascension or temperature difference occurs between the exhaust pipe and exhaust gases.

3. The vacuum pump exhaust pipe of the chemical vapor deposition apparatus according to claim 2, characterized in that a material of the anti-sticking inner pipes is Polytetrafluoroethene.

4. The vacuum pump exhaust pipe of the chemical vapor deposition apparatus according to claim 2, characterized in that the anti-sticking inner pipe is installed at a joint of the vacuum pump outlet and the exhaust pipe.

5. The vacuum pump exhaust pipe of the chemical vapor deposition apparatus according to claim 2, characterized in that the anti-sticking inner pipe is installed at a joint of the scrubber and the exhaust pipe.

6. The vacuum pump exhaust pipe of the chemical vapor deposition apparatus according to claim 2, characterized in that the anti-sticking inner pipes are installed at a joint of the vacuum pump outlet and the exhaust pipe and at a joint of the scrubber and the exhaust pipe at the same time.

7. The vacuum pump exhaust pipe of the chemical vapor deposition apparatus according to claim 4, characterized in that outer surfaces of portions of the exhaust pipe which are not installed with the anti-sticking inner pipe are attached with heating tapes.

8. The vacuum pump exhaust pipe of the chemical vapor deposition apparatus according to claim 5, characterized in that outer surfaces of portions of the exhaust pipe which are not installed with the anti-sticking inner pipe are attached with heating tapes.

9. The vacuum pump exhaust pipe of the chemical vapor deposition apparatus according to claim 6, characterized in that outer surfaces of portions of the exhaust pipe which are not installed with the anti-sticking inner pipes are attached with heating tapes.

10. The vacuum pump exhaust pipe of the chemical vapor deposition apparatus according to claim 2, characterized in that the anti-sticking inner pipes are installed at all the inner walls of the exhaust pipe.

11. A vacuum pump of a chemical vapor deposition apparatus, wherein two ports of the vacuum pump are respectively connected to an outlet of the chemical vapor deposition apparatus and a scrubber, and the vacuum pump comprises a exhaust pipe connected to the scrubber, characterized in that anti-sticking inner pipes are installed inside the exhaust pipe and contacted with inner walls of the exhaust pipe, and have a property of preventing accumulation of powder particles generated by gases through the exhaust pipe while pressure ascension or temperature difference occurs between the exhaust pipe and exhaust gases, a material of the anti-sticking inner pipes is Polytetrafluoroethene.

12. The vacuum pump of the chemical vapor deposition apparatus according to claim 11, characterized in that the anti-sticking inner pipes are installed at a joint of the vacuum pump outlet and the exhaust pipe and at a joint of the scrubber and the exhaust pipe.

13. The vacuum pump of the chemical vapor deposition apparatus according to claim 11, characterized in that the anti-sticking inner pipe is installed at a joint of the vacuum pump outlet and the exhaust pipe.

14. The vacuum pump of the chemical vapor deposition apparatus according to claim 11, characterized in that the anti-sticking inner pipe is installed at a joint of the scrubber and the exhaust pipe.

15. The vacuum pump of the chemical vapor deposition apparatus according to claim 12, characterized in that outer surfaces of portions of the exhaust pipe which are not installed with the anti-sticking inner pipes are attached with heating tapes.

16. The vacuum pump of the chemical vapor deposition apparatus according to claim 13, characterized in that outer surfaces of portions of the exhaust pipe which are not installed with the anti-sticking inner pipe are attached with heating tapes.

17. The vacuum pump of the chemical vapor deposition apparatus according to claim 14, characterized in that outer surfaces of portions of the exhaust pipe which are not installed with the anti-sticking inner pipe are attached with heating tapes.

18. The vacuum pump of the chemical vapor deposition apparatus according to claim 11, characterized in that the anti-sticking inner pipes are installed at all the inner walls of the exhaust pipe.

\* \* \* \* \*